United States Patent
Yang et al.

(10) Patent No.: US 7,550,767 B2
(45) Date of Patent: Jun. 23, 2009

(54) LIQUID CRYSTAL DISPLAY DEVICE AND FABRICATING METHOD THEREOF

(75) Inventors: Joon-Young Yang, Gyeonggi-do (KR); Jung-Il Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/529,434

(22) Filed: Sep. 29, 2006

(65) Prior Publication Data

US 2007/0077692 A1  Apr. 5, 2007

(30) Foreign Application Priority Data

Sep. 29, 2005  (KR)  ................. 10-2005-0091623

(51) Int. Cl.
*H01L 31/00* (2006.01)
(52) U.S. Cl. ........................ 257/59; 438/149
(58) Field of Classification Search ................. 438/149; 257/59
See application file for complete search history.

(56) References Cited

U.S. PATENT DOCUMENTS 6,081,308 A * 6/2000 Jeong et al. ................ 349/42
2005/0285102 A1* 12/2005 Koo et al. .................. 257/40
2007/0178710 A1* 8/2007 Muyres et al. ............. 438/778

* cited by examiner

*Primary Examiner*—Thao X Le
*Assistant Examiner*—Kimberly Trice
(74) *Attorney, Agent, or Firm*—Morgan Lewis & Bockius LLP (57) ABSTRACT

A method for fabricating an LCD device includes forming sequentially a first conductive layer, a first insulation layer, a semiconductor layer, and an ohmic contact layer on a first substrate; forming a gate line by patterning the first conductive layer, the first insulation layer, the semiconductor layer, and the ohmic contact layer; exposing a first gate pad electrode connected with the gate line; insulating the gate line; forming a data line that intersects the gate line, wherein an electrode part is formed extending from the data line such that the electrode part is formed over the semiconductor layer and the ohmic layer, and defines an active pattern; forming a transparent electrode layer on the substrate including the electrode part; and forming source, drain, and pixel electrodes simultaneously by patterning at least one of the transparent electrode layer, the electrode part, and the ohmic contact layer.

7 Claims, 10 Drawing Sheets

LIQUID CRYSTAL DISPLAY DEVICE AND FABRICATING METHOD THEREOF

The present invention claims the benefit of Korean Patent Application No. 2005-91623 filed in Korea on Sep. 29, 2005, which is hereby incorporate by reference.

BACKGROUND OF THE INVENTION

1. Field of the Invention

The present invention relates to a liquid crystal display (LCD) device fabricated by using three masks and a fabrication method thereof, and more particularly, to an LCD device fabricated using three masks by a process that uses amorphous silicon as a channel layer.

2. Discussion of the Related Art

An LCD device includes an active element such as a thin film transistor (TFT) in each pixel region to drive each pixel. The driving method of the LCD device is commonly called an active matrix driving method. In the active matrix type driving method, the active elements are disposed in pixels arranged in a matrix form to drive the pixels.

Figure 1:
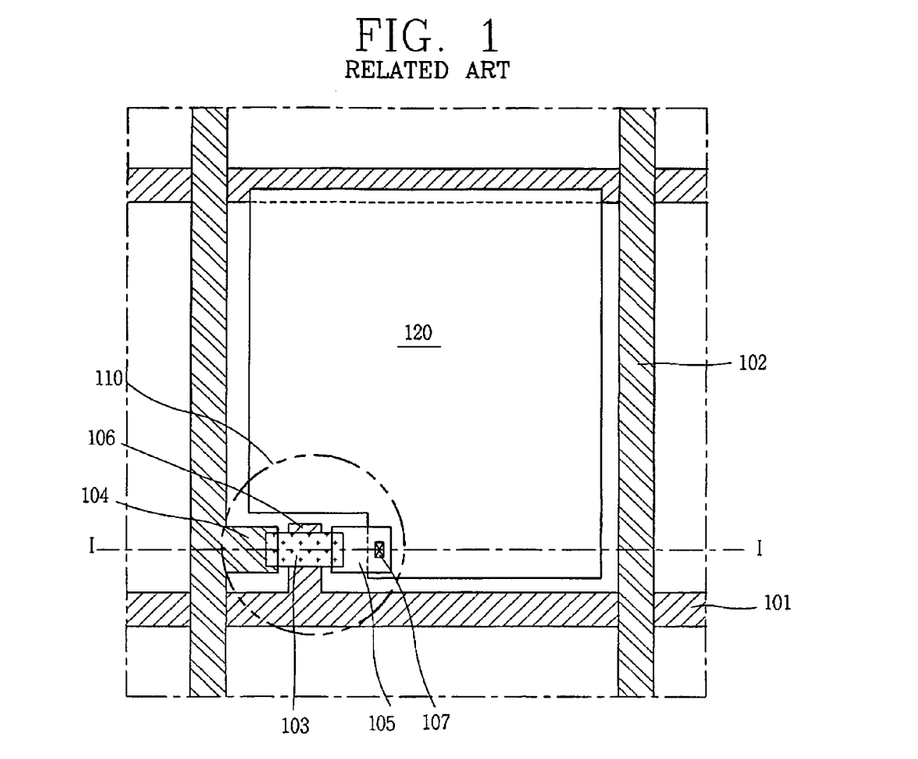
FIG. 1 is a plan view showing a unit pixel of a related art TFT liquid crystal display (LCD) device.
Figure 2:
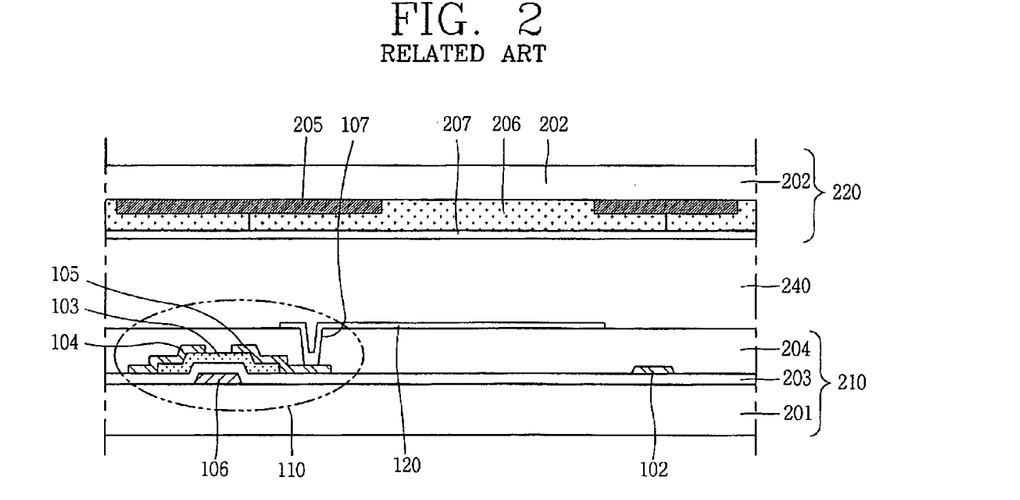
FIG. 2 is a sectional view of the related art TFT LCD device.

FIGS. 1 and 2 show a related art active matrix type TFT LCD device. As shown in FIG. 1, the related art TFT LCD device uses TFT 110 as the active element. In the TFT LCD device, the N×M number of pixels are arranged on a first substrate 201 (FIG. 2) and the TFT 110 is formed at respective intersections of gate lines 101 and data lines 102. The gate lines 101 delivers scanning signals applied from an external driver and the data lines 102 delivers image signals.

The TFT 110 includes a gate electrode 106 connected with the gate line 101, a semiconductor layer 103 formed on the gate electrode 106, and source and drain electrodes 104 and 105 formed on the semiconductor layer 103. The scanning signals applied through the gate lines 101 activate the semiconductor layer 103. A pixel electrode 120 is formed at a display region of the pixel, which is connected with the source electrode 104 and the drain electrode 105 to receive an image signals when the semiconductor layer 103 is activated.

The structure of the related art TFT LCD device will be described in detail with reference to FIG. 2. FIG. 2 is a sectional view of the related art TFT LCD device taken along line I-I of FIG. 1. With reference to FIG. 2, the TFT 110 is formed on a first substrate 201 made of a transparent material such as glass. The TFT 110 includes a gate electrode 106 formed on the first substrate 201, a gate insulation layer 203 formed on an entire surface of the first substrate 201 including the gate electrode 106 formed thereon, a semiconductor layer 103 formed on the insulation layer 203, source and drain electrodes 104 and 105 formed on the semiconductor layer 103, and a passivation layer 204 formed on the entire surface of the first substrate 201 including TFT 110. Accordingly, an array substrate 210 is defined having above described components.

A pixel electrode 120 is formed on the passivation layer 204 and is connected with the drain electrode 105 of the TFT 110 through a contact hole 107. The contact hole 107 is defined through the passivation layer 204.

A color filter substrate 220 facing the array substrate 210 includes a second substrate 202 made of a transparent material such as glass, a black matrix 205 formed on the second substrate over the TFT and over non-display regions defined between the pixel regions, and a color filter layer 206 to implement actual color. The black matrix 205 prevents transmission of light to the non-display regions. A common electrode 207 for providing an electric field to the liquid crystal layer 240 can be additionally formed on the color filter layer 206. When the color filter substrate 220 and the array substrate 210 are attached, a liquid crystal layer 240 is formed therebetween to complete the related art TFT LCD device.

The related art TFT LCD device is fabricated through a complicated process such as a photolithography process using masks. The related art method for fabricating the TFT LCD device will be described with reference to FIGS. 3A through 3E.

Figure 3A:
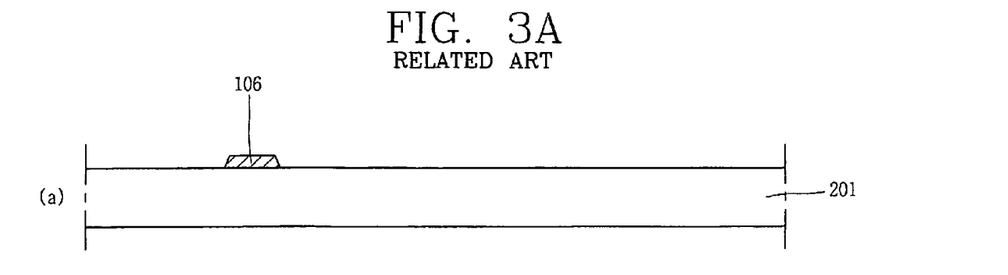
FIGS. 3A through 3E are section views showing a related art fabrication process of the related art TFT LCD device.

As shown in FIG. 3A, a metal layer is stacked on the entire surface of the first substrate 201, on which photoresist is coated, and then a gate line (not shown) and a gate electrode 106 connected with the gate line are formed by performing the photolithography process.

Figure 3B:
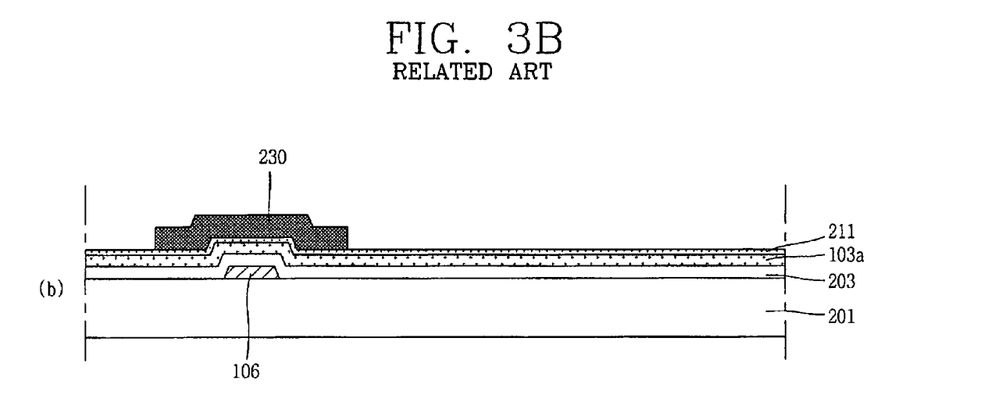

Next, with reference to FIG. 3B, a gate insulation layer 203, a semiconductor layer 103a and an ohmic contact layer 211 are sequentially formed on the entire surface of the first substrate 201 with the gate electrode 106 formed thereon. Subsequently, a photosensitive film 230 is coated on the ohmic contact layer 211, and then the photolithography process is performed to form an active pattern. The active pattern includes a stack structure of the semiconductor layer and the ohmic contact layer.

Figure 3C:
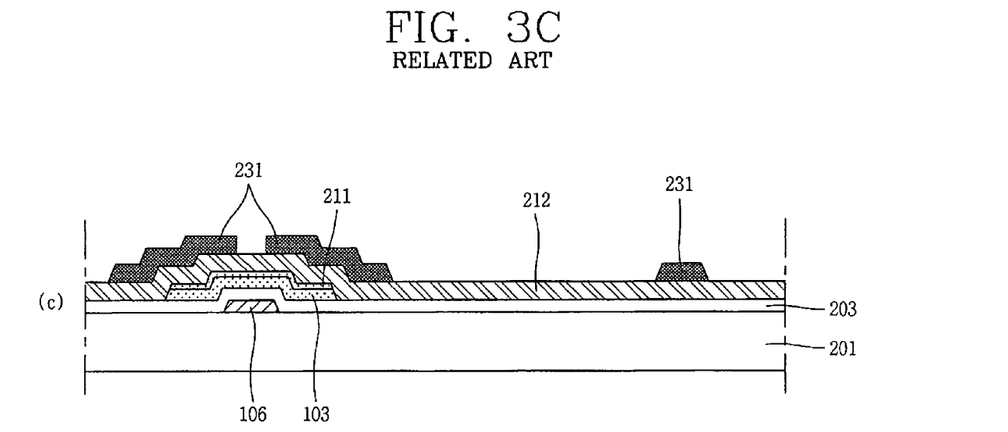

Next, as shown in FIG. 3C, a conductive layer 212 is formed on the entire surface of the first substrate 201 and a photosensitive film pattern 231 is formed on the conductive layer 212. Then, source and drain electrodes 104 and 105 are formed using the photosensitive film pattern 231 as a mask.

Figure 3D:
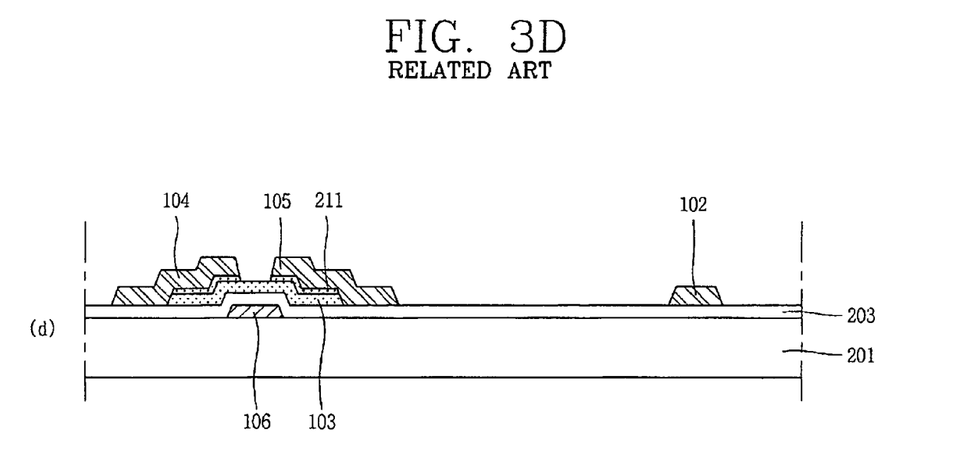

As shown in FIG. 3D, when the conductive layer 212 is patterned to form the source and drain electrodes 104 and 105, a channel region is defined through the conductive layer 212 and the ohmic contact layer 211 through etching process. In addition, the channel region is defined at a middle portion of the active pattern.

Figure 3E:
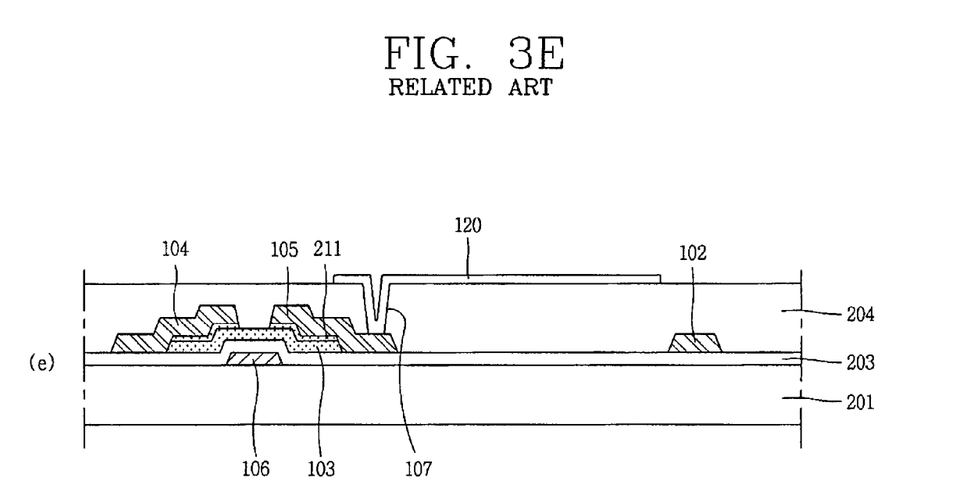

As shown in FIG. 3E, a passivation layer 204 can be additionally formed on the first substrate 201 to protect the TFT. Photoresist is formed on the passivation layer 204 and the photolithography process is performed to form a contact hole 107 exposing a portion of the drain electrode 105. A transparent material such as indium tin oxide (ITO) is formed on the passivation layer 204 and within the contact hole 107 and then etched to form the pixel electrode 120.

Although not shown, after the black matrix 205 and the color filter layer 206 are formed on the second substrate 202, the first and second substrates are attached and a liquid crystal layer is filled therebetween to complete the related art TFT LCD device.

As mentioned above, in order to fabricate the related art TFT LCD device that uses the semiconductor layer as the channel layer, the plurality of masking processes are required. For example, in the related fabrication process of the TFT LCD device, five masking processes are performed to form the TFT, and six masking processes are performed to form up to the pixel electrode.

However, the related art fabricating method is an expensive process, since every time a mask process is introduced, several supplementary processes are required, thereby increasing a total fabrication cost. In addition, etching process discharges environmentally harmful materials. Therefore, efforts for reducing a total number of masks in fabricating the TFT LCD devices are actively pursued.

SUMMARY OF THE INVENTION

Accordingly, the present invention is directed to a liquid crystal display device and method of fabricating the same that substantially obviates one or more problems due to limitations and disadvantages of the related art.

An object of the present invention is to provide a light crystal display (LCD) device that reduces a total number of masks while fabricating the LCD device, hence improves a total production yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described a liquid crystal display device and fabricating method thereof includes a method for fabricating an LCD device includes forming sequentially a first conductive layer, a first insulation layer, a semiconductor layer, and an ohmic contact layer on a first substrate; forming a gate line by patterning the first conductive layer, the first insulation layer, the semiconductor layer, and the ohmic contact layer; exposing a first gate pad electrode connected with the gate line; insulating the gate line; forming a data line that intersects the gate line, wherein an electrode part is formed extending from the data line such that the electrode part is formed over the semiconductor layer and the ohmic layer, and defines an active pattern; forming a transparent electrode layer on the substrate including the electrode part; and forming source, drain, and pixel electrodes simultaneously by patterning at least one of the transparent electrode layer, the electrode part, and the ohmic contact layer.

In another aspect, a liquid crystal display (LCD) device includes a unit pixel region defined by intersections of gate lines and data lines; an active pattern overlapping a respective portion of the gate line; a switching element including source and drain electrodes overlapping the active pattern over the gate line; an insulation pattern to insulate edges of the gate line; and a pixel electrode connected with the drain electrode and formed in the unit pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Figure 4:
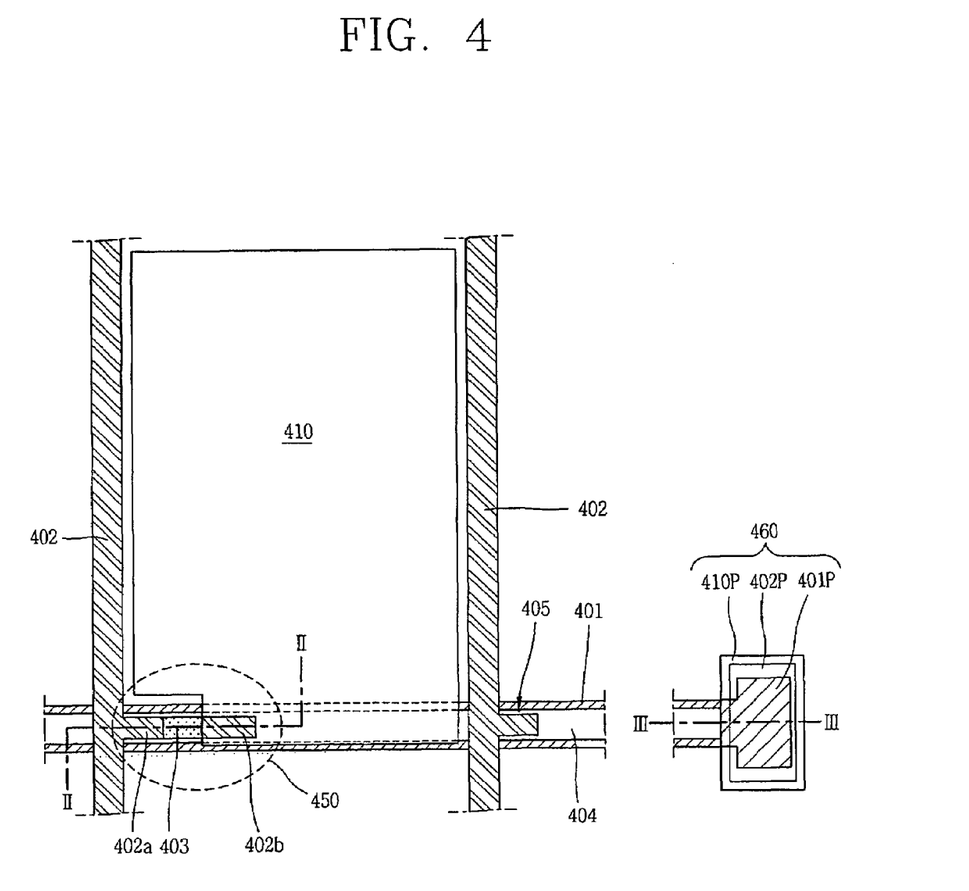
FIG. 4 is a plan view of a unit pixel of an LCD according to an exemplary embodiment of the present invention.
Figure 5A:
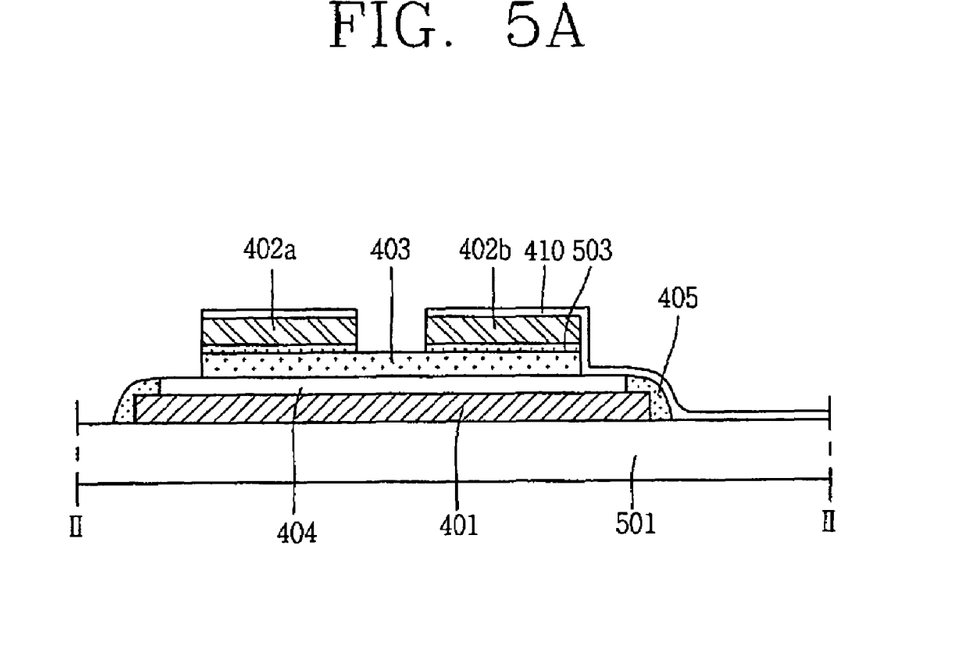
FIGS. 5A and 5B are sectional views detailing an exemplary TFT and an exemplary gate pad part of the LCD device, respectively, according to the exemplary embodiment of the present invention.
Figure 5B:
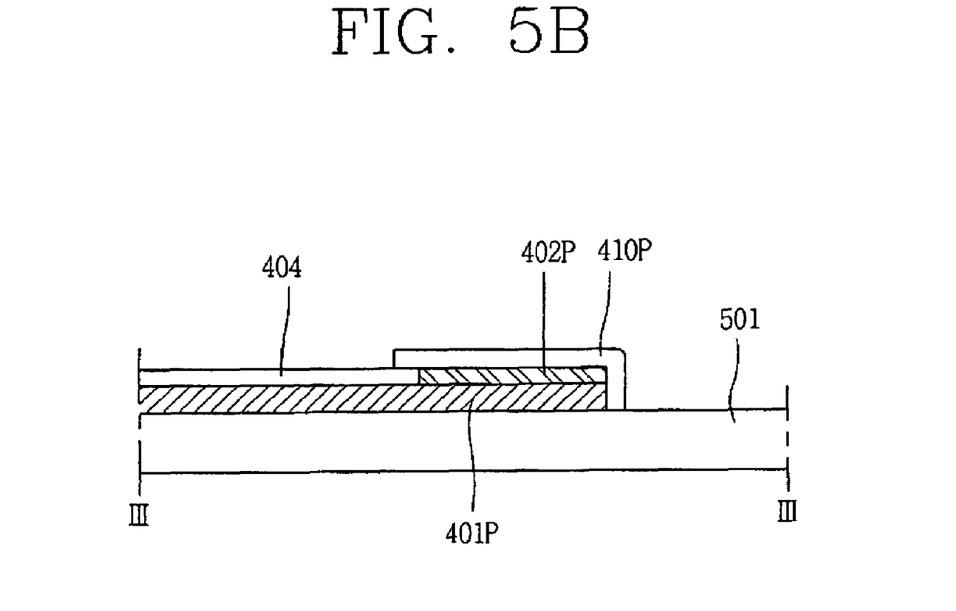

An exemplary structure of an liquid crystal display (LCD) device according to an exemplary embodiment of the present invention will be described in detail with reference to the accompanying drawings. FIG. 4 shows a plan view of a unit pixel of the LCD device according to the exemplary embodiment of the present invention, FIG. 5A shows a sectional view of an exemplary thin film transistor (TFT) region and FIG. 5B shows a sectional view of an exemplary gate pad part.

As shown in FIG. 4, a unit pixel of an exemplary LCD device includes a plurality of gate lines 401 that are parallel to each other and a plurality of data lines 402 vertically cross the gate lines 401. As a switching element to drive the unit pixel, a TFT is also provided in the unit pixel.

The TFT 450 includes an active pattern 403 that completely overlaps the gate line 401, a source electrode 402a branched from a respective data line 402 and formed on the active pattern 403, and a drain electrode 402b formed on the active pattern 403. The source electrode 402a and the drain electrode 402b are formed only on the active pattern 403 and completely overlap the active pattern 403.

A pixel electrode 410 that directly connects with the drain electrode 402b is formed within the unit pixel. The pixel electrode 410 contacts the drain electrode 402b over the gate line 401 to form a storage capacitor with a first insulation layer 404. The first insulation layer 404 is formed between the drain electrode 402b and the gate line 401. The gate line 401 is covered by the first insulation layer 404 and has a narrower width than the gate line 401. The first insulation layer 404 is formed along the long-center line of the gate line 401, thus, edges of the gate line 401 are exposed. To insulate the exposed edges of the gate line 401, an insulation pattern 405 is additionally formed. The insulating pattern 405 is formed of an organic film.

A gate pad part 460 for providing a scan signal to the gate line 401 is additionally formed at one end of the gate line 401. The gate pad part 460 includes a first gate pad electrode 401P connected with the gate line 401, a second gate pad electrode 402P made of the same material as that of the source and drain electrodes 402a and 402b; and a third gate pad electrode 410P made of the same transparent electrode material as the pixel electrode 410.

Next, detailed structure of the exemplary TFT (switching element) and the gate pad part 460 will be explained with reference to FIGS. 5A and 5B. FIG. 5A is a sectional view taken along line II-II of FIG. 4 and FIG. 5B is a sectional view taken along line III-III of FIG. 4.

As shown in FIG. 5A, the gate line 401 having a certain width is formed on the transparent first substrate 501 made of glass and other suitable material. The first insulation layer 404 is formed on the gate line 401 and has a narrower width than the gate line 401. Accordingly, edges of the gate line 401 are exposed. The insulation pattern 405 is formed over the gate line 401 covering the exposed edges of the gate line 401. Thus, the gate line 401 is completely insulated by the first insulation layer 404 and the insulation pattern 405. In the exemplary embodiment, the gate line 401 can be made of a conductive metal, for example, a metal including Cu, Al, Mo, Au, Pt, AlNd, and other suitable material.

The first insulation layer 404 can be made of silicon nitride or silicon oxide. The insulation pattern 405 can be selected from organic insulation materials that can be ashed. For example, the insulation pattern 405 can be made of benzocyclobutene (BCB). The active pattern 403 is formed on the first insulation layer 404. The width of the active pattern 403 may be formed narrower than a width of corresponding first insulation layer 404. Or, the width of the active pattern 403 may be formed as equal width as the corresponding first insulation layer 404. As shown in FIG. 5A, the active pattern 403 has a narrower width than the corresponding first insulation layer 404.

An ohmic contact layer 503 is formed on the active pattern 403, and the source and drain electrodes 402a and 402b are formed on the ohmic contact layer 503 and the active pattern 403. The source and drain electrodes 402a and 402b are formed within the width of the active pattern 403. A transparent electrode material is formed on the source and drain electrodes 402a and 402b, and the transparent electrode material on the drain electrode 402b extends to form a pixel electrode 410.

As shown in FIG. 5B, the gate pad part 460 is formed at the end of the gate line 401 and includes a first gate pad electrode 401P made of a same conductive material as the gate line 401, a second gate pad electrode 402P formed of the same conductive layer as the source and drain electrodes 402a and 402b, and a third gate pad electrode 410P made of the same transparent electrode material as the pixel electrode 410.

As described above, the upper surface of the gate line 401, excluding the gate pad part 460, is covered by the first insulation layer 404 and the insulation pattern 405 to completely insulate the gate line 401.

An exemplary method of fabricating the LCD device having the above-described structure will be explained with reference to FIGS. 6A through 6G and 7A through 7F.

FIGS. 6A through 6G are sectional views showing the exemplary fabrication process of the LCD device according to the exemplary embodiment of the present invention, and FIGS. 7A through 7F are plan views showing the exemplary fabrication process of the LCD device according to the exemplary embodiment of the present invention.

Figure 6A:
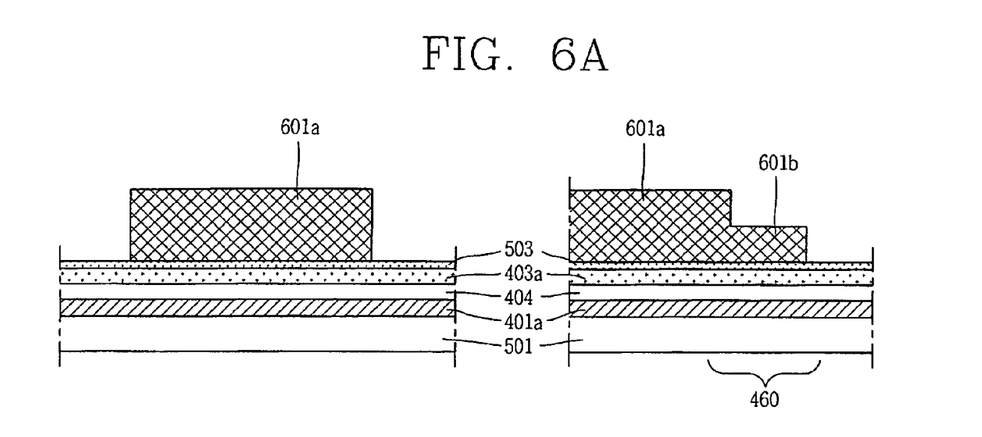
FIGS. 6A through 6G are sectional views showing an exemplary fabrication process of the LCD device according to the exemplary embodiment of the present invention.

As shown in FIG. 6A, a first conductive layer 401a, a first insulation layer 404, a semiconductor layer 403a and an ohmic contact layer 503 are sequentially deposited on the first transparent substrate 501. The first conductive layer 401a can be formed on the first substrate 501 by sputtering a conductive metal. The first conductive layer 401a can be made of a metal including Cu, Al, Mo, Au, Pt, AlNd, and other suitable material. The first insulation layer 404 can be formed by depositing an inorganic material such as silicon nitride or silicon oxide on the first conductive layer 401a using a PECVD method.

The semiconductor layer 403a can be formed by depositing a semiconductor material such as amorphous silicon on the first insulation layer 404 by the PECVD method. The ohmic contact layer 503 can be formed by doping an impurity ion of the fifth group element or the third group element on the semiconductor layer 403a. The ohmic contact layer 503 is formed for ohmic-contacting between the semiconductor layer 403a and the conductive layer used as the source and drain electrodes 402a and 402b. The ohmic contact layer 503 can be formed by making a respective portion of the upper surface of the semiconductor layer 403a conductive or by depositing a separate conductive semiconductor layer.

Subsequently, photoresist is formed on the ohmic contact layer 503. Thereafter, the photoresist is exposed and developed by applying a first mask (not shown) to form a photoresist pattern 601a and 601b. The photoresist pattern 601a defines the gate line 401 and the photoresist pattern 601b defines the gate pad part 460. In this case, the first mask can be a slit (diffraction) mask or a half-tone mask such that the gate pad part 460 is diffracted and exposed.

Figure 7A:
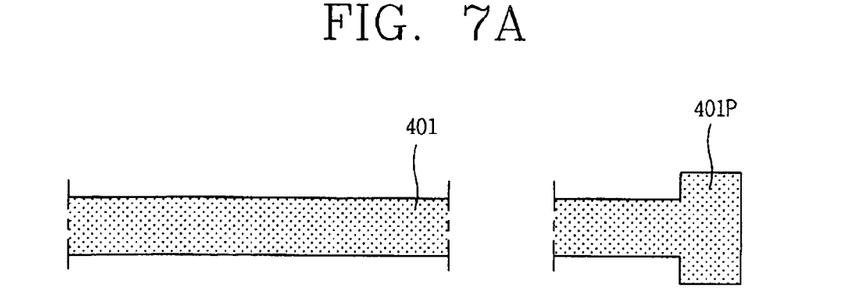
FIGS. 7A through 7F are plan views showing the exemplary fabrication process of the LCD device according to the exemplary embodiment of the present invention.

As shown in FIGS. 6A and 7A, the photoresist patterns 601a and 601b are positive type photoresist. As shown in FIG. 6A, the photoresist patterns 601a and 601b has a step-like structure over the end of the gate line 401 and the gate pad part 460. Subsequently, the ohmic contact layer 503, the semiconductor layer 403a, the first insulation layer 404 and the first conductive layer 401 are sequentially etched using the photoresist patterns 601a and 601b (as etching masks) to form the gate line 401 and the gate pad part 460. Accordingly, portions of the first insulation layer 404, the semiconductor layer 403a and the ohmic contact layer 503 remain on the gate line 401 and on the gate pad part 460.

Figure 6B:
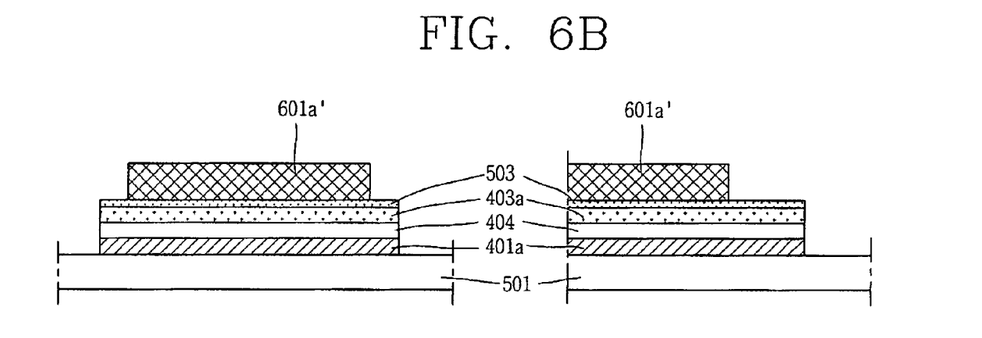
Figure 7B:
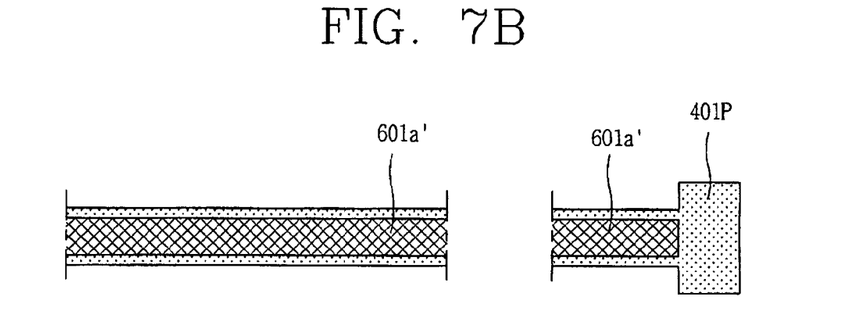

As shown in FIGS. 6B and 7B, the photoresist pattern 601b and a portion of the photoresist patterns 601a are removed by ashing process to form the gate line 401 and the gate pad part 460. Because of the step-like structure, the photoresist pattern 601b over the gate pad part 460 has a thickness thinner than the photoresist pattern 601a. Thus, the photoresist pattern 601b is completely removed by ashing process to expose the first conductive layer 401a (gate pad part 460). In addition, during the ashing process, a portion of the photoresist pattern 601a on the gate line 401 is removed, exposing the edges of the gate line 401. After the ashing process, only the ashed photoresist patterns 601a' remains on the gate line 401.

Figure 6C:
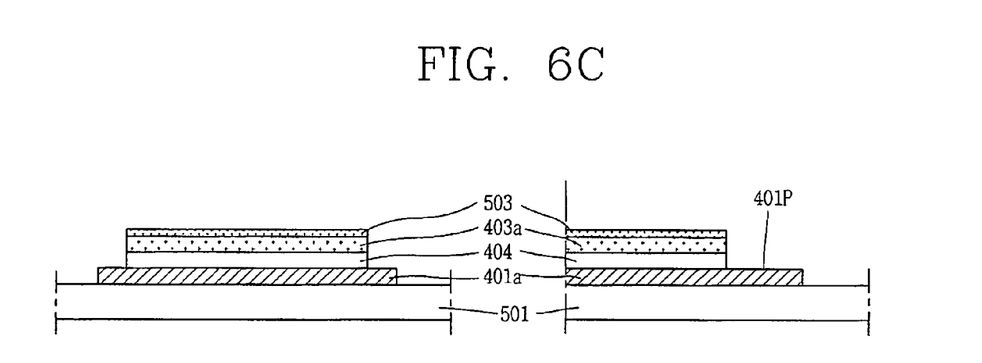
Figure 7C:
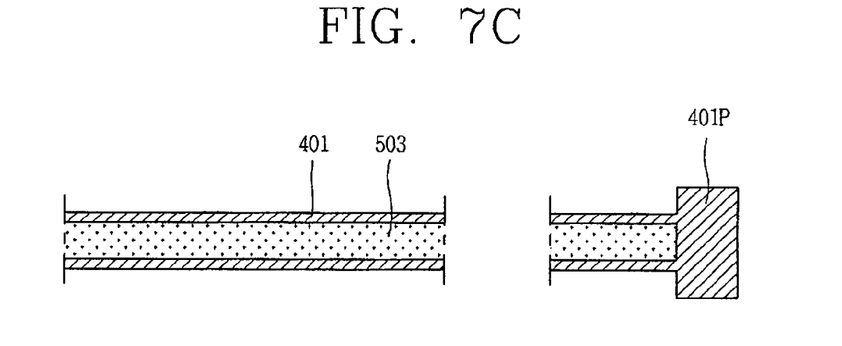

Next, as shown in FIGS. 6C and 7C, the ohmic contact layer 503, the semiconductor layer 403a, and the first insulation layer 404 formed at the gate pad part 460 are etched using the ashed photoresist pattern 601a' as an etching mask to expose the first gate pad electrode 401P. At this time, the ohmic contact layer 503, the semiconductor layer 403a, and the first insulation layer 404 formed on the edges of the gate lines 401 are etched to expose the edge portions of the gate line 401.

Figure 6D:
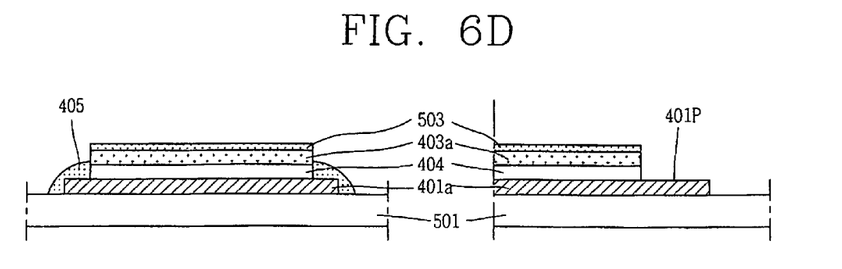
Figure 7D:
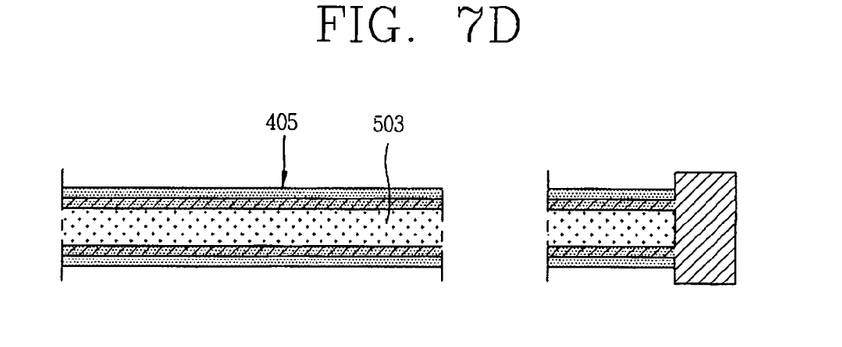

Next, as shown in FIGS. 6D and 7D, to insulate the exposed edges of the gate line 401, an organic insulation film is formed on the entire surface of the first substrate 501. The organic insulation film can be made of benzocyclobutene (BCB). Then, a portion of the organic insulation film is removed by ashing process to expose the ohmic contact layer 503 and the first gate pad electrode 401P. The remaining portion of the organic insulation film covers the exposed edges of the gate line 401, thereby forming the insulation pattern 405. As a result, the gate line 401 is completely insulated by the first insulation layer 404 and the insulation pattern 405. The formation of the insulation pattern 405 over the exposed edges of the gate line 401 by the organic insulation film takes advantages of the differences in etching ratios.

Figure 6E:
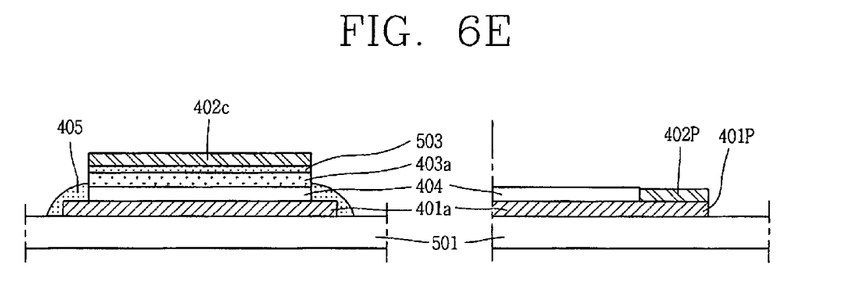
Figure 7E:
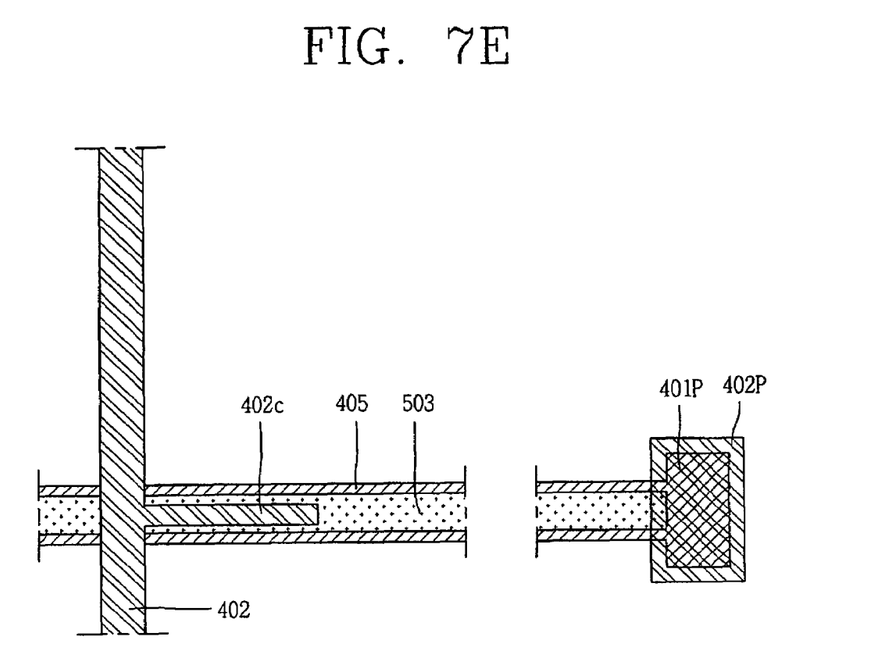

Subsequently, as shown in FIGS. 6E and 7E, a second conductive layer (not shown) is deposited on the entire surface of the first substrate including the insulation pattern 405 formed thereon by the sputtering method. The data line 402 (not shown) and an electrode part 402c that extends from a respective data line 402 are defined by a photolithography process. The data line 402 and the electrode part 402c are formed of the second conductive layer. At the same time, a second gate pad electrode 402P formed of the second conductive layer is defined by the same photolithography process.

The photolithography process includes forming a second conductive layer (not shown) on the first substrate; forming a photoresist (not shown) on the second conductive layer; forming a photoresist pattern (not shown) by exposing and developing the photoresist by applying a second mask (not shown) to form a photoresist pattern; defining the data line 402 and the electrode part 402c using the photoresist pattern;

etching the second conductive layer using the photoresist pattern (etching mask); and stripping the photoresist pattern. The ohmic contact layer 503, the semiconductor layer 403a formed below the conductive layer 503, and the second conductive layer are removed as etching process using the photoresist pattern is performed. The second conductive layer can be made of copper, aluminum, an aluminum alloy, chromium, a chromium alloy, and other suitable material.

When a photoresist pattern (not shown) will be formed for defining the data line 402 and electrode part 402c, the photoresist pattern (not shown) is formed addly on the first gate pad electrode 401P. Accordingly, after etching the second conductive layer using the photoresist pattern as a mask, the second gate pad electrode 402P is remained.

In addition to defining the data line 402 and the electrode part 402c, the second gate pad electrode 402P is formed when the second conductive layer is etched. The electrode part 402c defines the width of the active pattern 403. The photoresist pattern (not shown) on the first gate pad electrode 401P is to protect the first gate pad electrode 401P having the similar etching characteristics with the gate line 401 while the second conductive layer is patterned by wet etching.

Figure 6F:
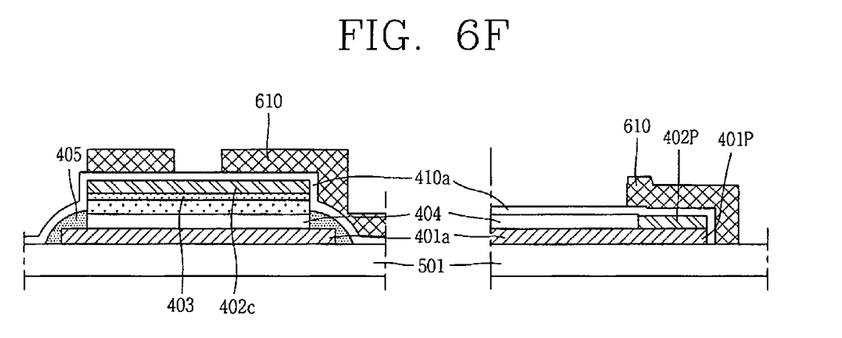
Figure 7F:
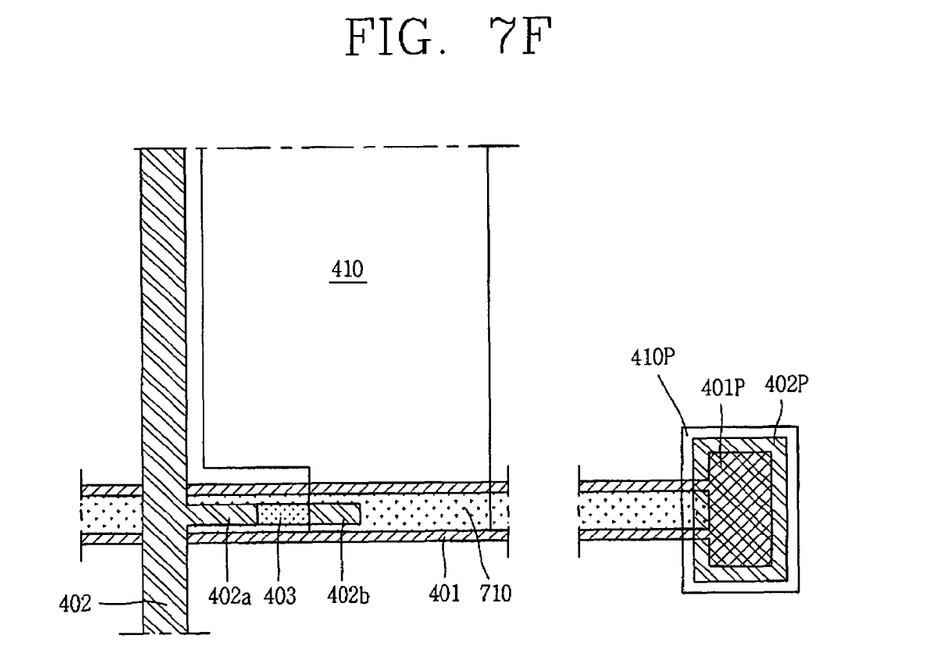

Next, the process of forming the source/drain electrodes 402a and 402b and the pixel electrode 410 using a third mask (not shown) will be explained with reference to FIGS. 6F and 7F. As shown in FIG. 6F, a transparent electrode material 410a such as ITO is uniformly formed over the first substrate 501 including the electrode part 402c formed thereon. The transparent electrode material 410a is formed on the data line 402, the electrode part 402c, the unit pixel region, and the second gate pad electrode 402P.

Subsequently, photoresist is formed on the transparent electrode material 410a, and then the source/drain electrodes 402a and 402b and the pixel electrode 410 are formed using the third mask through the photolithography process. The photolithography process includes forming the photoresist on the transparent electrode material 410a; exposing and developing the photoresist by applying the third mask to form a photoresist pattern 610 that defines the source and drain electrodes 402a and 402b of the TFT (alternatively, defines a channel region of the TFT), the pixel electrode 410, and the third gate pad electrode 410P; etching the transparent electrode material 410a using the photoresist pattern 610 as an etching mask to form the pixel electrode 410; and removing a portion of the electrode part 402c and a portion of ohmic contact layer 503 over the channel region of TFT by applying the photoresist pattern 610 as the etching mask, so that source and drain electrodes 402a and 402b are formed. In addition, a portion of semiconductor layer 403a is exposed within the channel region through the etching process. Furthermore, the photoresist pattern 610 formed over the gate pad part 460 is used to pattern the transparent electrode material 410a through the etching process to form the third gate pad electrode 410P.

Figure 6G:
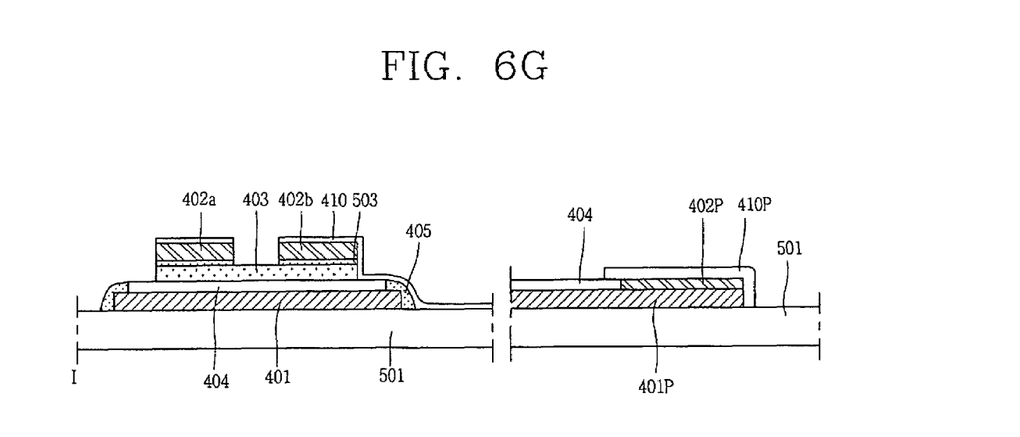

Accordingly, as shown in FIG. 6G, the pixel electrode 410 is directly connected with the drain electrode 402b and overlap with the gate line 401. As shown in FIGS. 6G and 7F, the first insulation layer 404 is formed between the pixel electrode 410 and the gate line 401 to form a storage capacitor 710. Thereafter, the photoresist pattern 610 is stripped, the exemplary LCD device as shown in FIGS. 6G and 7F is completed.

As described above, the LCD device and the method for fabricating the LCD device according to the exemplary embodiment of the present invention have the following advantages; reduced number of photo masks (three masks) and minimized production cost to improve production yield.

It will be apparent to those skilled in the art that various modifications and variations can be made to the liquid crystal display device and fabricating method thereof without departing from the spirit or scope of the invention. Thus, it is intended that the present invention covers the modifications and variations of this invention provided they come within the scope of the appended claims and their equivalents.

What is claimed is:

1. A liquid crystal display (LCD) device, comprising:
 a unit pixel region defined by intersections of gate lines and data lines;
 a insulator layer and an active pattern overlapping a respective portion of the gate line;
 a switching element including source and drain electrodes overlapping the active pattern and the insulator layer over the gate line;
 an insulation pattern on both sides of the gate line and the insulator layer to insulate both sides of the gate line, wherein the insulation pattern is made of an organic insulation material and is not in contact with the source and drain electrodes; and
 a pixel electrode connected with the drain electrode and formed in the unit pixel region.

2. The LCD device of claim 1, wherein the active pattern completely overlaps the respective portion of the gate line.

3. The LCD device of claim 1 further includes a gate pad part, the gate pad part comprising:
 a first gate pad electrode formed at one end of the gate line;
 a second gate pad electrode formed on the first gate pad electrode; and
 a third gate pad electrode formed on the second gate pad electrode.

4. The LCD device of claim 3, wherein the second gate pad electrode is made of the same conductive material as the source and drain electrodes.

5. The LCD device of claim 3, wherein the third gate pad electrode is made of the same transparent electrode material as the pixel electrode.

6. A liquid crystal display (LCD) device, comprising:
 a unit pixel region defined by intersections of gate lines and data lines;
 a insulator layer and an active pattern overlapping a respective portion of the gate line;
 a switching element including source and drain electrodes overlapping the active pattern and the insulator layer over the gate line, wherein the insulator layer is formed as an inorganic material;
 an insulation pattern on both sides of the gate line and the insulator layer to insulate both sides of the gate line, wherein the insulation pattern is formed as an organic insulation material and is not in contact with the source and drain electrodes; and
 a pixel electrode connected with the drain electrode and formed in the unit pixel region.

7. A liquid crystal display (LCD) device, comprising:
 a unit pixel region defined by intersections of gate lines and data lines;
 a insulator layer and an active pattern overlapping a respective portion of the gate line;
 a switching element including source and drain electrodes overlapping the active pattern and the insulator layer over the gate line, wherein the insulator layer is formed as an inorganic material;
 an insulation pattern on both sides of the gate line and the insulator layer to insulate both sides of the gate line, wherein the insulation pattern is formed as an organic insulation material and is not contact with the source and drain electrodes;

a pixel electrode connected with the drain electrode and formed in the unit pixel region; and a gate pad part, the gate pad part comprising:

a first gate pad electrode formed at one end of the gate line;

a second gate pad electrode formed on the first gate pad electrode; and a third gate pad electrode formed on the second gate pad electrode.

* * * * *